United States Patent
Le Pallec et al.

(10) Patent No.: US 7,430,229 B2
(45) Date of Patent: Sep. 30, 2008

(54) OPTO-ELECTRONIC DEVICE COMPRISING AN INTEGRATED LASER AND AN INTEGRATED MODULATOR AND ASSOCIATED METHOD OF PRODUCTION

(75) Inventors: Michel Le Pallec, Massy (FR); Christophe Kazmierski, Morangis (FR)

(73) Assignee: Alcatel (FR)

( * ) Notice: Subject to any disclaimer, the term of this patent is extended or adjusted under 35 U.S.C. 154(b) by 74 days.

(21) Appl. No.: 11/483,184

(22) Filed: Jul. 10, 2006

(65) Prior Publication Data
US 2007/0041411 A1    Feb. 22, 2007

(30) Foreign Application Priority Data
Jul. 8, 2005    (FR) .................................. 05 07322

(51) Int. Cl.
*H01S 3/10*    (2006.01)
*H01S 5/00*    (2006.01)
(52) U.S. Cl. ........................................ 372/50.1; 372/26
(58) Field of Classification Search ............ 372/45.013, 372/26, 46.015, 50.1
See application file for complete search history.

(56) References Cited

U.S. PATENT DOCUMENTS 5,901,265 A    5/1999    Tohyama et al.

2002/0105992 A1*    8/2002    Arakaea et al. ................ 372/50
2004/0013144 A1*    1/2004    Kise et al. ...................... 372/45

OTHER PUBLICATIONS

Abstract EP 1233486 A Aug. 21, 2002 The Furukawa Electric Co.
Abstract EP 1372229A Dec. 17, 2003 Agilent Technologies Inc.
Aoki M et al : High Speed (10 Gbit/s) and Low Drive Voltage (1v Peak to Peak) Electroabsorption Modulator Integrated DFB Laser with Semi Insulating Buried Heterostructure Jun. 4, 1992.

* cited by examiner

*Primary Examiner*—Armando Rodriguez
(74) *Attorney, Agent, or Firm*—Lowe Hauptman Ham & Berner, LLP

(57) ABSTRACT

The field of the invention is that of integrated optical emission devices comprising a laser emission section and a section for modulating the optical power emitted by the laser, also known as ILM devices, the acronym standing for Integrated Laser Modulator. The invention is aimed at an ILM device comprising a laser section and a modulation section produced in a common structure of P.I.N type, the said structure successively comprising a substrate produced from n-doped semiconductor material, a buried active zone, a p-doped vertical confinement layer and a semi-insulating lateral confinement layer, the part of the structure belonging to the laser section comprising a blocking layer produced from n-doped semiconductor material disposed between the semi-insulating lateral confinement layer and the vertical confinement layer so as to reduce the leakage current existing between the said layers. The performance and the reliability of the final device is thus improved.

7 Claims, 4 Drawing Sheets

OPTO-ELECTRONIC DEVICE COMPRISING AN INTEGRATED LASER AND AN INTEGRATED MODULATOR AND ASSOCIATED METHOD OF PRODUCTION

BACKGROUND OF THE INVENTION

1. Field of the Invention

The field of the invention is that of optical emission devices comprising an integrated component comprising at least one laser emission section and a section for modulating the optical power emitted by the laser. These systems are also called ILMs, the acronym standing for Integrated Laser Modulator or EMLs, the acronym standing for Electro-absorption Modulated Laser. The modulation section is generally also called an EAM, the acronym standing for Electro Absorption Modulator.

These devices are used mainly in the field of high-throughput digital telecommunications. The throughputs are typically from a few gigabits to several tens of gigabits per second.

2. Description of the Prior Art

It is possible to modulate a laser beam in three different ways. A first method consists in directly modulating the source laser by controlling its feed current. However, this technique does not make it possible to attain the performance necessary for high throughput. It is also possible to use an external modulator, physically separate from the source laser and whose performance is not limited by that of the laser. However, this method poses significant integration and positioning problems. Finally, it is possible to produce an integrated component comprising, on the same substrate, a laser emission section and a section for modulating the optical power emitted by the laser. The best compromise between the desired performance and the technological production and integration problems is thus obtained.

The latter type of device, the ILM, is known and is described, for example, in French patent FR2 675 634. By way of example, an ILM device is represented diagrammatically in FIG. 1. It essentially comprises a laser section 1 and a modulation section 2. As indicated in FIG. 1, the laser is driven by a current I and the modulation section 2 is an electro-absorbant section, on/off controlled by a voltage signal V. At the output of the ILM device, a high-frequency modulated optical signal is emitted (straight barred arrow of FIG. 1).

Generally, the optical emission structure is a semi-conductor laser with a buried stripe also called a BRS structure, the acronym standing for Buried Ridge Stripe. A diagram of such a structure is represented in FIG. 2. It comprises essentially:

A first substrate 10 produced from n-doped semi-conductor material. The first substrate is generally produced from Indium Phosphide (InP);

An active part 11 formed by a stripe of rectangular cross section, the lower face of this active part lying on the first substrate 10. The active part has an optical index greater than that of the layers which surround it. It is of small section, of the order of a micron or a few microns, and generally consists of a set of layers forming quantum wells and barriers. The layers are conventionally produced from GaInAsP or from AlGaInAs;

A second substrate 12 produced from p-doped semi-conductor material. This second substrate is also produced from InP and it completely covers the lateral faces and the upper face of the active part 10;

A lower electrode 13 disposed under the first substrate 10 and an upper electrode 14 disposed on the second substrate 12. The electrodes convey the current necessary for the operation of the laser.

This configuration makes it possible to ensure, at one and the same time:

Confinement of the carriers injected into the stripe if the difference in forbidden bandwidth between the material of the first substrate and that of the second substrate is sufficient;

Bidirectional guidance of light if the difference in optical index between the material of the first substrate and that of the second substrate is also sufficient.

The benefit of this geometrical configuration is to obtain lasers with very low threshold current and with very high switching speed.

Since the appearance of this type of structure in the 1980s, technological developments have made it possible to improve the performance of this type of laser. Structures comprising semi-insulating layers are generally used. Descriptions of this type of structure will be found in French patent FR 91 04636. A diagram of such a structure is represented in FIG. 3. It comprises essentially:

A first substrate 10 produced from n-doped semi-conductor material, generally produced from InP;

An active part 11 formed by a stripe of rectangular cross section, the lower face of this active part lying on the first substrate 10;

a lateral confinement layer 15 surrounding the lateral faces of the stripe. This layer 15 is produced from semi-insulating semi-conductor material, generally produced from Fe-doped InP;

a vertical confinement layer 16 covering the upper face of the active part 10, the said layer 16 produced from p-doped semi-conductor material. The doping is generally zinc.

A lower electrode 13 disposed under the first substrate and an upper electrode 14 disposed on the vertical confinement layer 16 and on the lateral confinement layer 15. These electrodes convey the current necessary for the operation of the laser.

This type of laser is also called SI BH, the acronym standing for Semi-Insulating Burried Heterostructure.

Of course, in ILM devices, the laser section and the modulator section have the same buried structure. Devices having very good performance in terms of thermal dissipation, optical losses, stability of the optical modes and reliability are thus obtained. Moreover, the integration of the two emission and modulation functions in a single component makes it possible to substantially reduce costs.

However, a laser of SI BH type exhibits significant lateral leakage current due to fast decay of the resistivity of the lateral confinement layer when a positive voltage is applied to the structure. This effect is widely known and described. It results from the interdiffusion of the p dopants of the vertical confinement layer and of the dopants of the semi-insulating lateral confinement layer during the step of producing the vertical confinement layer. This leakage current appreciably degrades the performance of the laser.

There exist various techniques for attempting to reduce this problem. We shall cite:

The reducing of the surface area of the active structure during the step of lateral etching of the structure or the increasing of the thickness of the vertical confinement layer so as to retain a sufficiently resistive surface area. These solutions do not, however, completely eliminate the leakage current;

The use of blocking layers, preventing the diffusion of the p dopants. Unfortunately, in the case of an ILM device, this technology increases the stray capacitance of the modulation section which becomes excessive for use at high-throughput;

The use of other types of dopants such as Ruthenium which exhibit the drawbacks of being difficult to implement in epitaxial growth equipment and whose effectiveness has not been proved under laser conditions of use.

The use of other types of structures such as structures of PN—BH type, the acronym signifying P-type N-type Buried Heterostructure, comprising a truncated vertical confinement layer. However, these structures which have good performance call upon a complex fabrication process comprising additional steps of epitaxial growth and of cropping of the vertical confinement layer, which are difficult to control fully. This technology also leads to structures whose excessive stray capacitance does not permit high-throughput use.

SUMMARY OF THE INVENTION

The object of the invention is to propose an integrated component of ILM type comprising at least one laser emission section and a modulation section comprising a technologically well controlled structure of SI BH type exhibiting neither significant leakage current nor significant stray capacitance. Thus, a device according to the invention makes it possible to attain significant performance, compatible with high-throughput digital telecommunications while not exhibiting any particular production difficulties.

More precisely, the invention is aimed at an opto-electronic device, of the type with laser and integrated modulator comprising a laser section and a modulation section produced in a common structure of P.I.N type, the said structure successively comprising a substrate produced from n-doped semiconductor material, a buried active zone, a p-doped vertical confinement layer, the lateral faces of the active zone being surrounded by a semi-insulating lateral confinement layer produced from doped semi-conductor material, characterized in that the part of the structure belonging to the laser section comprises a blocking layer produced from n-doped semiconductor material disposed between the semi-insulating lateral confinement layer and the vertical confinement layer.

Advantageously, the substrate, the vertical confinement layer, the lateral confinement layer and the blocking layer are essentially produced from a first semi-conductor material whose components belong to groups III and V of the periodic table.

More precisely, the blocking layer can be produced from InP (Indium Phosphide), from InGaAsP (Indium-Gallium-Arsenic-Phosphorus) or from InAlAs (Indium-Aluminium-Arsenic), the active zone being produced from InGaAsP (Indium-Gallium-Arsenic-Phosphorus).

Advantageously, the dopings of the substrate and of the vertical confinement layer are of the order of $10^{18}$ atoms/centimetre$^3$, the doping of the lateral confinement layer is $10^{17}$ atoms/centimetre$^3$ and the doping of the blocking layer is of the order of $10^{18}$ atoms/centimetre.

Advantageously, the width of the active zone equals about 1.5 microns and the thickness of the common structure equals a few microns, the thickness of the blocking layer is, for its part, less than a micron.

Advantageously, the structure comprises a screen layer or buffer layer disposed between the substrate and the active layer, the said layer also being produced from Indium Phosphide (InP).

The invention relates also to a method of producing an opto-electronic device of the type with laser and integrated modulator comprising at least one of the preceding characteristics. The said method comprises at least the following steps:

Step 1: Production on the substrate of the active zone by means of a first epitaxial growth and etching of the said zone;

Step 2: Production of the semi-insulating lateral confinement layer by means of a second epitaxial growth;

Step 5: Production of the P-doped vertical confinement layer by means of a third epitaxial growth;

characterized in that the method of production comprises, furthermore, the following two additional steps carried out successively between the second step and the fifth step which are:

Step 3: production of the blocking layer over the entirety of the semi-insulating lateral confinement layer;

Step 4: removal of the blocking layer in the zone of the structure corresponding to the modulation section.

Advantageously, step 4 of the method is carried out by chemical or mechanical etching.

BRIEF DESCRIPTION OF THE DRAWINGS

The invention will be better understood and other advantages will appear on reading the non-limiting description which follows and by virtue of the appended figures, of which.

MORE DETAILED DESCRIPTION

Figure 1:
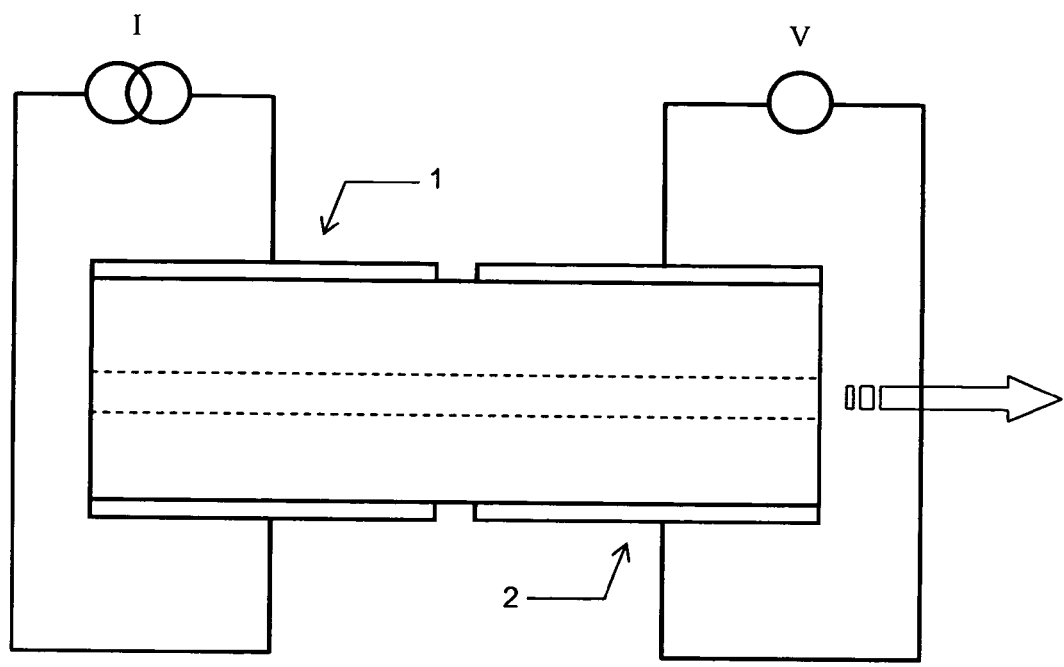
FIG. 1 represents the basic diagram of an opto-electronic device of ILM type.
Figure 2:
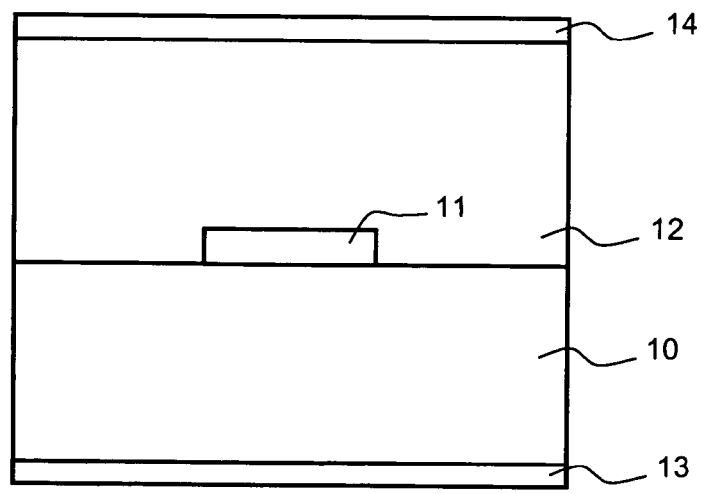
FIG. 2 represents a sectional view of a laser with buried stripe of BRS type.
Figure 3:
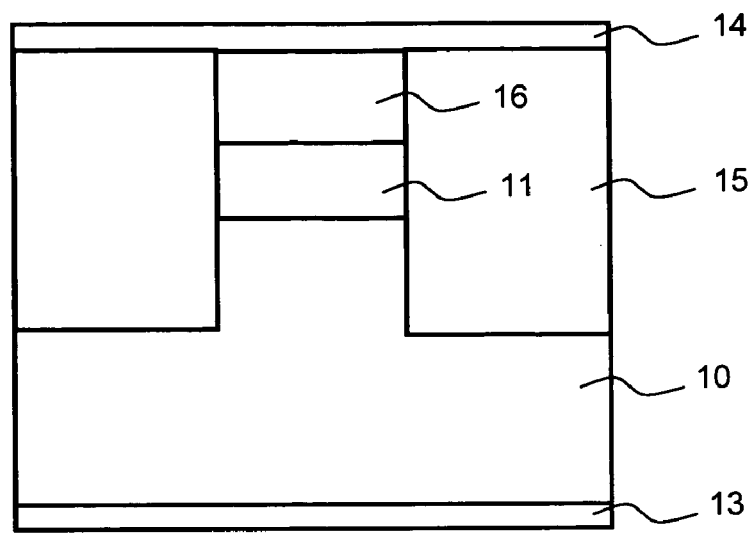
FIG. 3 represents a sectional view of a laser with buried stripe of BRS type with semi-insulating layer.
Figure 4:
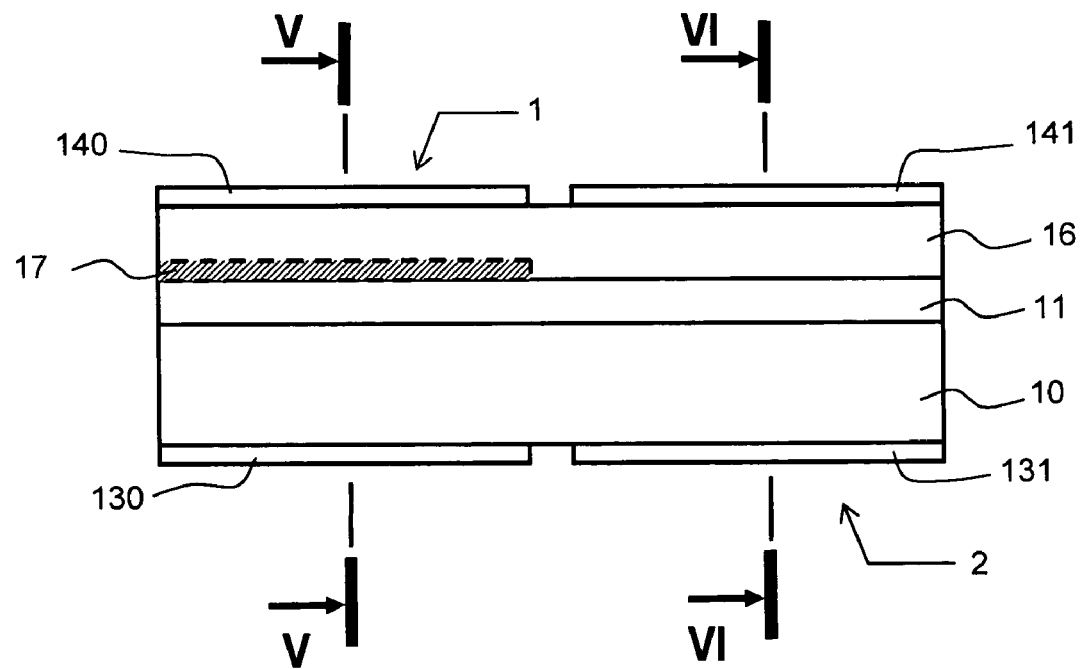
FIG. 4 represents a first sectional view of an ILM device according to the invention.

The sectional view of FIG. 4 represents an ILM type device according to the invention comprising a laser section and a modulation section. It essentially comprises a common structure of P.I.N type, the said structure comprising successively:

a substrate 10 produced from n-doped semi-conductor material, a buried active zone 11 formed by a stripe of rectangular cross section, a p-doped vertical confinement layer 16, the lateral faces of the active zone being surrounded by a semi-insulating lateral confinement layer, not represented in the figure, produced from doped semi-conductor material.

The laser section comprises a blocking layer 17 produced from n-doped semi-conductor material disposed between the semi-insulating lateral confinement layer and the vertical confinement layer.

The substrate, the vertical confinement layer, the lateral confinement layer and the blocking layer are essentially produced from a first semi-conductor material whose components belong to groups III and V of the periodic table. By way of example, the said first material is Indium Phosphide (InP). The dopings of the substrate and of the vertical confinement layer are of the order of $10^{18}$ atoms/centimetre$^3$ and the doping of the lateral confinement layer is $10^{17}$ atoms/centimetre$^3$.

The structure is organized as two sections 1 and 2 driven by two independent sets of electrodes 130, 140 and 131, 141 disposed respectively on the lower face of the substrate 10 and the upper face of the vertical confinement layer 16. The electrodes 130 and 131 can be linked together by a common earth. By way of example, these electrodes comprise a first conducting layer which can be of p-doped InGaAs. The thickness of this layer is less than a micron and its doping is of the order of $10^{19}$ atoms/centimetre$^3$. On this first layer is deposited the metallic electrical contact proper.

The section 1 corresponds to the laser section and the section 2 corresponds to the modulation section. The laser section 1 comprises a blocking layer 17 produced from n-doped semi-conductor material disposed between the semi-insulating lateral confinement layer and the vertical confinement layer 16.

Figure 5:
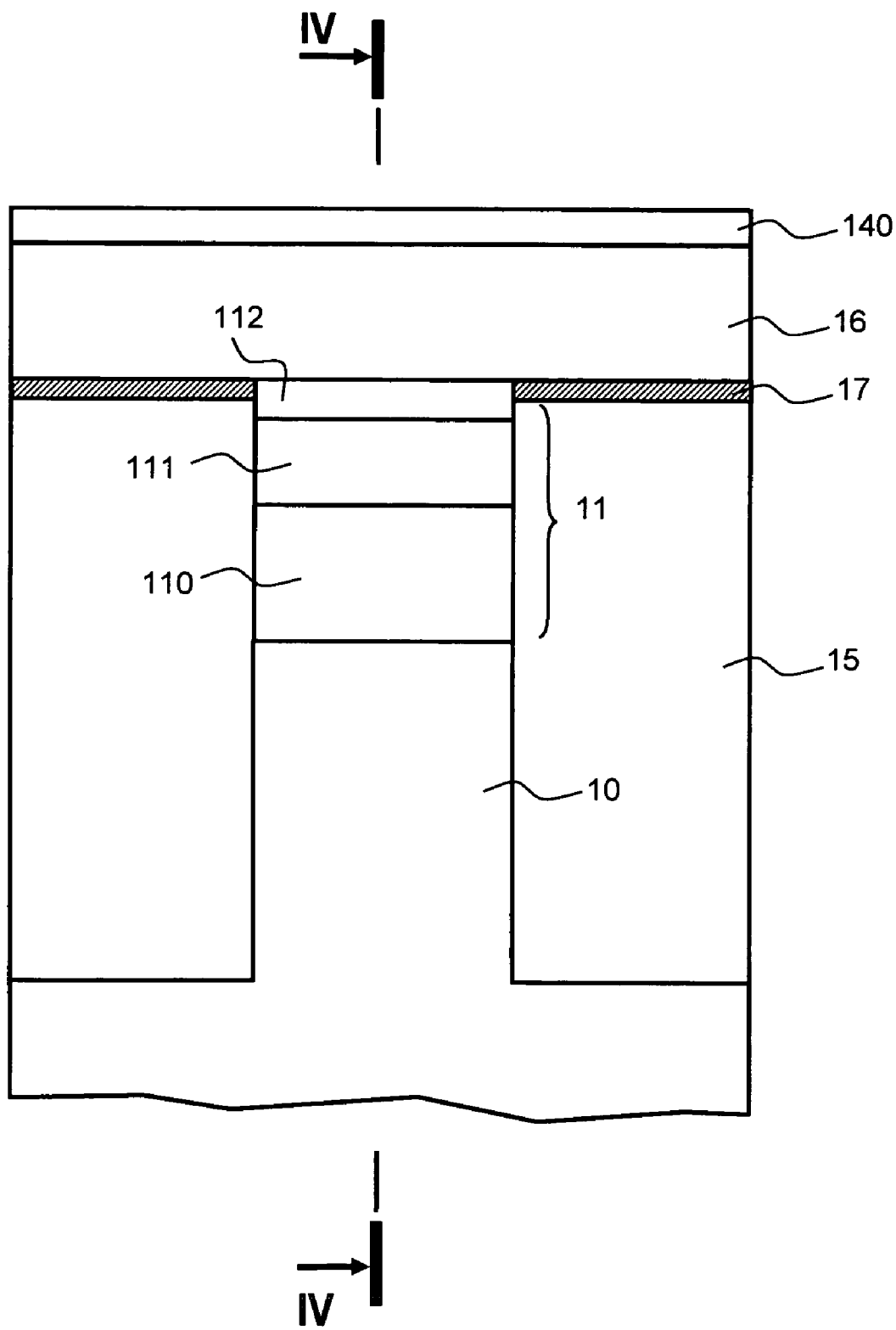
FIG. 5 represents a second sectional view in the laser section of an ILM device according to the invention.
Figure 6:
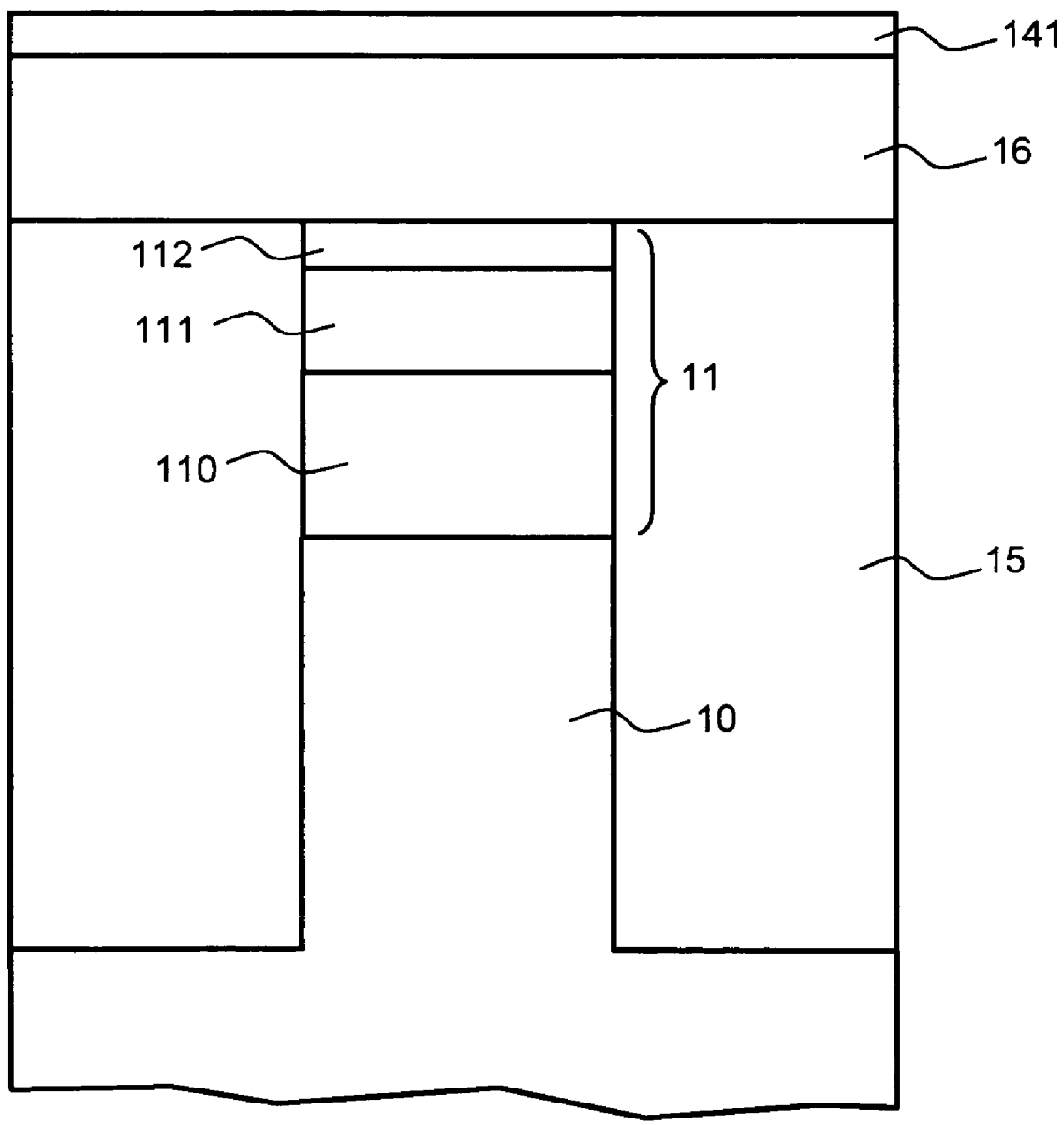
FIG. 6 represents a third sectional view in the modulator section of an ILM device according to the invention.

FIGS. 5 and 6 represent two sectional views of the device of FIG. 4 in two planes perpendicular to that of FIG. 4. These views make it possible to better specify the internal arrangement of the various layers of the structure. In these sectional views, the bottom part of the structure comprising the electrodes 130 and 131 is not represented.

In FIGS. 5 and 6, the active zone 111 is buried within the structure. Its lower face is in contact with the substrate 10. Its lateral faces are in contact with the semi-insulating lateral confinement layer 15, its upper face is in contact with the vertical confinement layer 16. The total thickness of the common structure equals a few microns.

The width of the active zone equals about 1.5 microns and its thickness is less than a micron.

The active zone necessarily comprises a layer 111 of active material which can be, for example, InGaAsP (Indium-Gallium-Arsenic-Phosphorus) or be a combination of the family of AlInGaAsP materials. (Aluminium-Indium-Gallium-Arsenic-Phosphorus). The composition of the active material determines the emission wavelength of the laser, generally situated in the near infra-red for applications in telecommunications. It can however comprise other layers such as a buffer layer 110 or a protection layer 112, the buffer layer 110, because of its mode of growth possesses superior crystalline quality, it is also produced from Indium Phosphorus (InP).

As indicated in FIG. 5, the blocking layer of the laser section is disposed on either side of the upper face of the active zone, between the semi-insulating lateral confinement layer 15 and the vertical confinement layer 16.

The blocking layer is produced from n-doped semi-conductor material which can be, for example, Indium Phosphide (InP) or InGaAsP (Indium-Gallium-Arsenic-Phosphorus) or InAlAs (Indium-Aluminium-Arsenic) or a combination of the family of the AlInGaAsP (Aluminium-Indium-Gallium-Arsenic-Phosphorus) materials. The doping of the blocking layer is of the order of $10^{18}$ atoms/centimetre$^3$.

Its thickness is typically a few tenths of a micron.

The blocking layer limits the interdiffusion of the dopants between the vertical and lateral confinement layers 15 and 16. It makes it possible to preserve the semi-insulating nature of the lateral confinement layer without introducing stray capacitances or additional resistances.

As indicated in FIG. 6, the blocking layer is limited to the laser section, the modulation section not comprising any blocking layer. Ionic insulation provides the boundary between the laser section and the modulation section. This therefore eliminates any stray capacitance in the modulation section.

The production of a device according to the invention does not present any particular difficulty.

It essentially comprises the following steps:
Step 1: Production on the substrate of the active zone by means of a first epitaxial growth, followed by etching so as to leave a central mesa comprising the final active zone;
Step 2: Production of the semi-insulating lateral confinement layer by means of a second epitaxial growth;
Step 3: Production of the blocking layer over the entirety of the semi-insulating lateral confinement layer;
Step 4: Removal of the blocking layer in the zone of the structure corresponding to the modulation section. This removal can be carried out either by chemical attack, or by mechanical or dry etching. The required accuracy is of the order of a few hundred nanometres.
Step 5: Production of the semi-insulating vertical confinement layer by means of a third epitaxial growth;
Step 6: Production of the contact electrodes.

The production of the layers by epitaxial growth and their delimitation by chemical or mechanical etching forms part of the knowledge of the person skilled in the art. Examples of methods of this type will be found in French patents FR 2 675 634 and FR 2 820 891.

What is claimed is:

1. Opto-electronic device, of the type with laser and integrated modulator comprising: a laser section and a modulation section produced in a common structure of P.I.N type, the said structure successively comprising a substrate produced from n-doped semi-conductor material, a buried active zone, a p-doped vertical confinement layer, the lateral faces of the active zone being surrounded by a semi-insulating lateral confinement layer produced from doped semi-conductor material, wherein the part of the structure belonging to the laser section comprises a blocking layer limited to the laser section produced from n-doped semi-conductor material disposed between the semi-insulating lateral confinement layer and the vertical confinement layer, the modulation section not comprising any blocking layer.

2. Opto-electronic device according to claim 1, wherein the substrate, the vertical confinement layer, the lateral confinement layer and the blocking layer are essentially produced from a first semi-conductor material whose components belong to groups III and V of the periodic table.

3. Opto-electronic device according to claim 1, wherein the blocking layer is produced from Indium Phosphide (InP) or from InGaAsP (Indium-Gallium-Arsenic-Phosphorus) or from InAlAs (Indium-Aluminium-Arsenic) or from a combination of the family of AlInGaAsP materials.

4. Opto-electronic device according to claim 1, wherein the active zone is produced from InGaAsP (Indium-Gallium-Arsenic-Phosphorus) or from a combination of the family of AlInGaAsP materials.

5. Opto-electronic device according to claim 1, wherein the width of the active zone equals about 1.5 microns and the thickness of the common structure equals a few microns.

6. Opto-electronic device according to claim 1, wherein the thickness of the blocking layer is less than a micron.

7. Opto-electronic device according to claim 1, wherein the structure comprises a screen layer disposed between the substrate and the active layer, the said layer also being produced from Indium Phosphorus (InP).

* * * * *